(12) United States Patent
Iinuma

(10) Patent No.: US 9,613,979 B2
(45) Date of Patent: Apr. 4, 2017

(54) SEMICONDUCTOR MEMORY DEVICE AND METHOD OF MANUFACTURING THE SAME

(71) Applicant: Kabushiki Kaisha Toshiba, Minato-ku (JP)

(72) Inventor: Toshihiko Iinuma, Yokkaichi (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 0 days.

(21) Appl. No.: 15/061,272

(22) Filed: Mar. 4, 2016

(65) Prior Publication Data

US 2017/0018567 A1 Jan. 19, 2017

Related U.S. Application Data

(60) Provisional application No. 62/193,271, filed on Jul. 16, 2015.

(51) Int. Cl.
| | |
|---|---|
| *H01L 29/74* | (2006.01) |
| *H01L 29/80* | (2006.01) |
| *H01L 21/8238* | (2006.01) |
| *H01L 27/11582* | (2017.01) |
| *H01L 27/1157* | (2017.01) |
| *H01L 21/28* | (2006.01) |

(52) U.S. Cl.
CPC .. *H01L 27/11582* (2013.01); *H01L 21/28282* (2013.01); *H01L 27/1157* (2013.01)

(58) Field of Classification Search
CPC ......... H01L 27/10891; H01L 27/11578; H01L 27/11582; H01L 27/11514; H01L 27/11551

USPC .................. 257/220, 263, 302, 328
See application file for complete search history.

(56) References Cited

U.S. PATENT DOCUMENTS

| | | | |
|---|---|---|---|
| 8,211,783 B2 | 7/2012 | Sakurai et al. | |
| 8,598,040 B2 | 12/2013 | Le Gouil et al. | |
| 2014/0080273 A1* | 3/2014 | Son | H01L 27/11578 438/269 |
| 2015/0137209 A1* | 5/2015 | Lee | H01L 27/11582 257/324 |

FOREIGN PATENT DOCUMENTS

| | | |
|---|---|---|
| JP | 2011-171698 | 9/2011 |
| JP | 2013-80909 | 5/2013 |

* cited by examiner

*Primary Examiner* — Hsien Ming Lee
(74) *Attorney, Agent, or Firm* — Oblon, McClelland, Maier & Neustadt, L.L.P.

(57) ABSTRACT

Manufactured in a method of manufacturing according to an embodiment is a semiconductor memory device including: control gate electrodes; a semiconductor layer; and a charge accumulation layer. In this method of manufacturing, inter-layer insulating layers and sacrifice layers are stacked alternately, an opening that penetrates the inter-layer insulating layers and sacrifice layers is formed, a first insulating layer, the charge accumulation layer, and the semiconductor layer are formed in the opening, the sacrifice layer and part of the first insulating layer are removed, and the control gate electrodes are formed. An internal diameter of the opening is smaller the more downwardly a portion of the opening is positioned. A film thickness of the first insulating layer is smaller the more downwardly a portion of the first insulating layer is positioned.

6 Claims, 14 Drawing Sheets

SEMICONDUCTOR MEMORY DEVICE AND METHOD OF MANUFACTURING THE SAME

CROSS-REFERENCE TO RELATED APPLICATIONS

This application is based upon and claims the benefit of U.S. Provisional Patent Application No. 62/193,271, filed on Jul. 16, 2015, the entire contents of which are incorporated herein by reference.

FIELD

Embodiments described herein relate to a semiconductor memory device and a method of manufacturing the same.

BACKGROUND

Description of the Related Art

A flash memory that stores data by accumulating a charge in a charge accumulation layer, is known. Such a flash memory is connected by a variety of systems such as NAND type or NOR type, and configures a semiconductor memory device. In recent years, increasing of capacity and raising of integration level of such a nonvolatile semiconductor memory device have been proceeding. Moreover, a semiconductor memory device in which memory cells are disposed three-dimensionally (three-dimensional type semiconductor memory device) has been proposed to raise the integration level of the memory.

DETAILED DESCRIPTION

Manufactured in a method of manufacturing a semiconductor memory device according to an embodiment is a semiconductor memory device comprising: a plurality of control gate electrodes and inter-layer insulating layers stacked alternately above a substrate; a semiconductor layer having as its longitudinal direction a direction perpendicular to the substrate, the semiconductor layer facing the plurality of control gate electrodes; and a charge accumulation layer positioned between the control gate electrode and the semiconductor layer. In this method of manufacturing, a plurality of the inter-layer insulating layers and sacrifice layers are stacked alternately above the substrate, an opening that penetrates a plurality of the inter-layer insulating layers and sacrifice layers is formed, a first insulating layer is formed in the opening, the charge accumulation layer and the semiconductor layer are formed in the opening, the sacrifice layer is removed, part of the first insulating layer is removed, and the control gate electrode is formed between the inter-layer insulating layers adjacent in the direction perpendicular to the substrate. Moreover, in this method of manufacturing, the opening is formed such that an internal diameter of the opening is smaller the more downwardly a portion of the opening is positioned. Furthermore, in this method of manufacturing, the first insulating layer is formed such that a film thickness of the first insulating layer is smaller the more downwardly a portion of the first insulating layer is positioned.

Next, nonvolatile semiconductor memory devices according to embodiments will be described in detail with reference to the drawings. Note that these embodiments are merely examples, and are not shown with the intention of limiting the present invention.

For example, the nonvolatile semiconductor memory devices described below have a structure in which a memory string extends linearly in a perpendicular direction to a substrate, but a similar structure may be applied also to a U-shaped structure in which the memory string is doubled back on an opposite side midway. In addition, each of the drawings of the nonvolatile semiconductor memory devices employed in the embodiments below is schematic, and thicknesses, widths, ratios, and so on, of layers are different from those of the actual nonvolatile semiconductor memory devices.

First Embodiment

[Semiconductor Memory Device]

Figure 1:
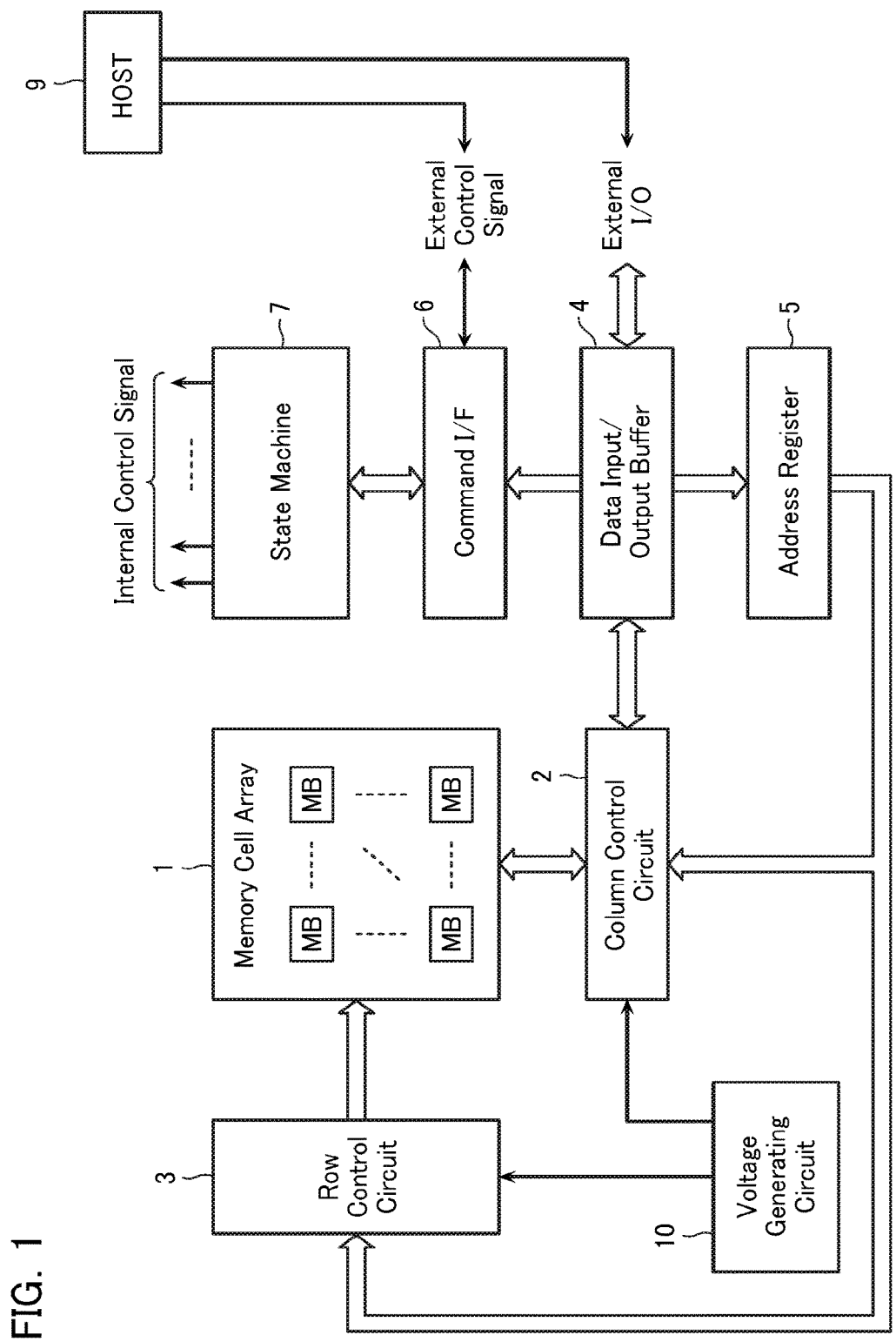
FIG. 1 is a block diagram of a nonvolatile semiconductor memory device according to a first embodiment.

FIG. 1 is a block diagram of a nonvolatile semiconductor memory device according to a first embodiment. The nonvolatile semiconductor memory device stores user data inputted from an external host 9, in a certain address in a memory cell array 1. In addition, the nonvolatile semiconductor memory device reads user data from a certain address in the memory cell array 1, and outputs the user data to the external host 9.

That is, as shown in FIG. 1, the nonvolatile semiconductor memory device includes the memory cell array 1 that stores user data. The memory cell array 1 includes a plurality of memory blocks MB. As will be described later with reference to FIG. 2, these memory blocks MB each include: a plurality of memory cells MC; and a bit line BL and a word line WL connected to these memory cells MC.

As shown in FIG. 1, the nonvolatile semiconductor memory device includes a column control circuit 2 provided in a periphery of the memory cell array 1. When performing write of user data, the column control circuit 2 transfers a voltage generated by a voltage generating circuit 10 to a desired bit line BL, according to the inputted user data. Moreover, the column control circuit 2 includes an unillustrated sense amplifier, and when performing read of user data, detects a voltage or current of a certain bit line BL.

As shown in FIG. 1, the nonvolatile semiconductor memory device includes a row control circuit 3 provided in a periphery of the memory cell array 1. The row control circuit 3 transfers a voltage generated by the voltage generating circuit 10 to a desired word line WL, and so on, according to inputted address data.

As shown in FIG. 1, the nonvolatile semiconductor memory device includes an address register 5 that supplies address data to the column control circuit 2 and the row control circuit 3. The address register 5 stores address data inputted from a data input/output buffer 4.

As shown in FIG. 1, the nonvolatile semiconductor memory device includes the voltage generating circuit 10 that supplies a voltage to the memory cell array 1 via the column control circuit 2 and the row control circuit 3. The voltage generating circuit 10 generates and outputs a voltage of a certain magnitude at a certain timing, based on an internal control signal inputted from a state machine 7.

As shown in FIG. 1, the nonvolatile semiconductor memory device includes the state machine 7 that inputs the internal control signal to the voltage generating circuit 10, and so on. The state machine 7 receives command data from the host 9, via a command interface 6, and performs management of read, write, erase, input/output of data, and so on.

As shown in FIG. 1, the nonvolatile semiconductor memory device includes the data input/output buffer 4 which is connected to the external host 9 via an I/O line. The data input/output buffer 4 receives write data from the external host 9, and transfers the write data to the column control circuit 2. Moreover, the data input/output buffer 4 receives command data from the external host 9, and transfers the command data to the command interface 6. In addition, the data input/output buffer 4 receives address data from the external host 9, and transfers the address data to the address register 5. Furthermore, the data input/output buffer 4 receives read data from the column control circuit 2, and transfers the read data to the external host 9.

As shown in FIG. 1, the nonvolatile semiconductor memory device includes the command interface 6 that receives an external control signal from the external host 9. The command interface 6 determines which of user data, command data, and address data inputted to the data input/output buffer 4 is, based on the external control signal inputted from the external host 9, and controls the data input/output buffer 4. In addition, the command interface 6 transfers to the state machine 7 command data received from the data input/output buffer 4.

Note that the column control circuit 2, the row control circuit 3, the state machine 7, the voltage generating circuit 10, and so on, configure a control circuit that controls the memory cell array 1.

Figure 2:
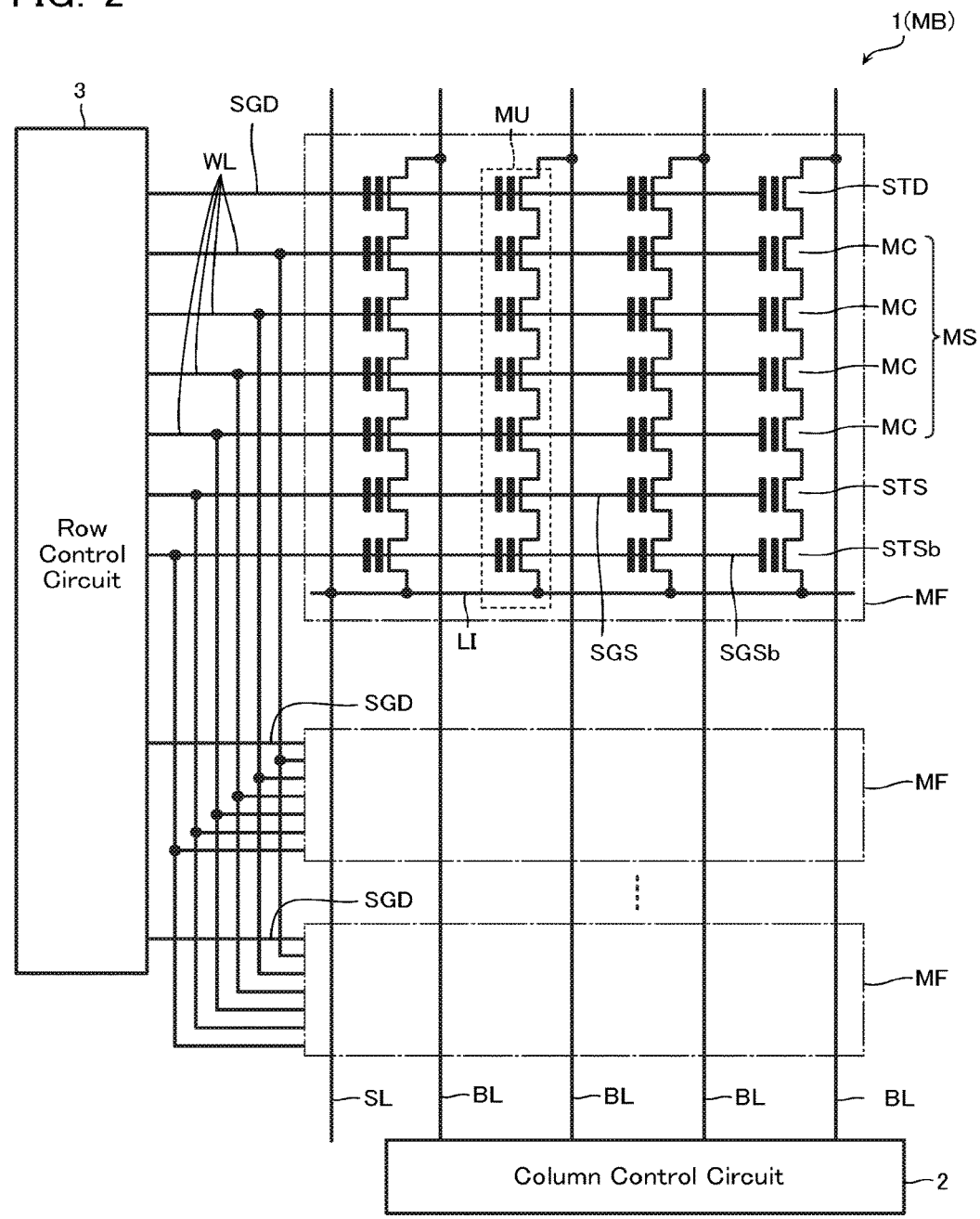
FIG. 2 is a circuit diagram showing a configuration of part of the same nonvolatile semiconductor memory device.

Next, a circuit configuration of part of the memory cell array 1 according to the present embodiment will be described with reference to FIG. 2. FIG. 2 is an equivalent circuit diagram showing a configuration of the memory block MB configuring the memory cell array 1.

As shown in FIG. 2, the memory block MB includes a plurality of the memory cells MC. The memory cells MC each store one bit or multiple bit of data configuring the above-mentioned user data. Moreover, in the memory block MB shown in FIG. 2, a certain drain side select gate line SGD and a certain word line WL are selected by the row control circuit 3, whereby a certain number of the memory cells MC are selected. These selected memory cells MC each have a bit line BL connected thereto, and a current or voltage of these bit lines BL attains a different magnitude according to data recorded in the memory cell MC. The column control circuit 2 determines data recorded in the plurality of memory cells MC by detecting the current or voltage of this bit line BL, and outputs this data as user data.

As shown in FIG. 2, the memory blocks MB each include a plurality of memory fingers MF. Commonly connected to the plurality of memory fingers MF are a plurality of the bit lines BL and a source line SL. Each of the memory fingers MF is connected to the column control circuit 2 via the bit lines BL, and is connected to an unillustrated source line driver via the source line SL.

The memory finger MF includes a plurality of memory units MU that have their one ends connected to the bit lines BL and have their other ends connected to the source line SL via a source contact LI. The memory units MU included in one memory finger MF are all connected to different bit lines BL.

As shown in FIG. 2, the memory unit MU includes a plurality of the memory cells MC connected in series. As will be mentioned later, the memory cell MC includes: a semiconductor layer functioning as a channel body; a charge accumulation layer; and a control gate electrode. Moreover, the memory cell MC accumulates a charge in the charge accumulation layer based on a voltage applied to the control gate electrode, and changes a control gate voltage for rendering the channel in a conductive state (threshold voltage). Hereafter, the plurality of memory cells MC connected in series will be called a "memory string MS". The row control circuit 3 transfers a voltage to a certain word line WL, thereby transferring this voltage to the control gate electrode of a certain memory cell MC in the memory string MS.

As shown in FIG. 2, commonly connected to the control gate electrodes of pluralities of the memory cells MC configuring different memory strings MS are, respectively, the word lines WL. These pluralities of memory cells MC are connected to the row control circuit 3 via the word lines WL. Moreover, in the example shown in FIG. 2, the word lines WL are provided independently to each of the memory cells MC included in the memory unit MU, and are provided commonly for all of the memory units MU included in one memory block MB.

As shown in FIG. 2, the memory unit MU includes a drain side select gate transistor STD connected between the memory string MS and the bit line BL. Connected to a control gate of the drain side select gate transistor STD is the drain side select gate line SGD. The drain side select gate line SGD is connected to the row control circuit 3, and selectively connects the memory string MS and the bit line BL based on an inputted signal. Moreover, in the example shown in FIG. 2, the drain side select gate line SGD is provided independently to each of the memory fingers MF, and is commonly connected to the control gates of all of the drain side select gate transistors STD in the memory finger MF. The row control circuit 3 selects a certain drain side select gate line SGD, thereby selectively connecting all of the memory strings MS in a certain memory finger MF to the bit lines BL.

Moreover, as shown in FIG. 2, the memory unit MU includes a source side select gate transistor STS and a lowermost layer source side select gate transistor STSb that are connected between the memory string MS and the source contact LI. Connected to a control gate of the source side select gate transistor STS is a source side select gate line SGS. In addition, connected to a control gate of the lowermost layer source side select gate transistor STSb is a lowermost layer source side select gate line SGSb. Moreover, in the example shown in FIG. 2, the source side select gate line SGS is commonly connected to all of the source side select gate transistors STS in the memory block MB. Similarly, the lowermost layer source side select gate line SGSb is commonly connected to all of the lowermost layer source side select gate transistors STSb in the memory block MB. The row control circuit 3 connects all of the memory strings MS in the memory block MB to the source line SL, based on an inputted signal.

Note that a dummy memory cell may be provided between the plurality of memory cells MC and the source side select gate transistor STS. As mentioned above, the memory cells MC each store one bit or multiple bit of data configuring the user data. In contrast, data is not recorded in the dummy memory cell.

Figure 3:
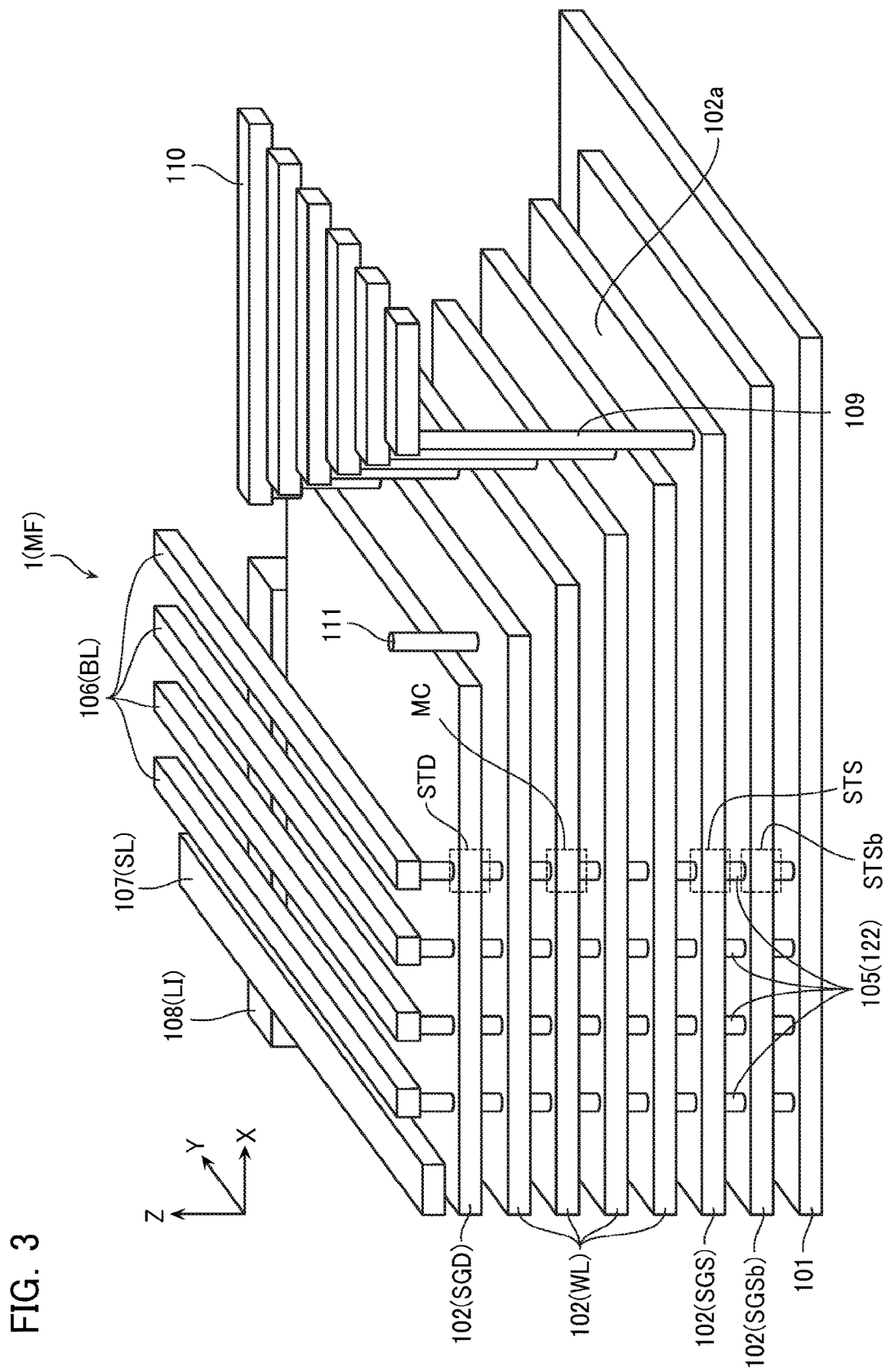
FIG. 3 is a perspective view showing a configuration of part of the same nonvolatile semiconductor memory device.

Next, a schematic configuration of the memory cell array 1 will be described with reference to FIG. 3. FIG. 3 is a schematic perspective view showing a configuration of part of the memory finger MF. Note that in FIG. 3, part of the configuration is omitted. Moreover, the configuration shown in FIG. 3 is merely an example, and a specific configuration may be appropriately changed.

As shown in FIG. 3, the memory finger MF includes: a substrate 101; and a plurality of conductive layers 102 stacked in a Z direction above the substrate 101. In addition, the memory finger MF includes a plurality of memory columnar bodies 105 extending in the Z direction. As shown in FIG. 3, an intersection of the conductive layer 102 and the memory columnar body 105 functions as the lowermost layer source side select gate transistor STSb, the source side select gate transistor STS, the memory cell MC, or the drain side select gate transistor STD. The conductive layer 102 is configured from a conductive layer of the likes of tungsten (W) or polysilicon, for example, and functions as the word line WL and control gate electrode of the memory cell MC, the source side select gate line SGS and control gate electrode of the source side select gate transistor STS, the drain side select gate line SGD and control gate electrode of the drain side select gate transistor STD, or the lowermost layer source side select gate line SGSb and control gate electrode of the lowermost layer source side select gate transistor STSb.

As shown in FIG. 3, the plurality of conductive layers 102 are formed in steps, at their ends in an X direction. That is, the conductive layer 102 includes a contact portion 102a that does not face a lower surface of the conductive layer 102 positioned in a layer above it. Moreover, the conductive layer 102 is connected to a via contact wiring line 109 at this contact portion 102a. Moreover, a wiring line 110 is provided at an upper end of the via contact wiring line 109. Note that the via contact wiring line 109 and the wiring line 110 are configured from a conductive layer of the likes of tungsten.

In addition, as shown in FIG. 3, the memory finger MF includes a support 111. The support 111 communicates with holes provided in the plurality of conductive layers 102. The support 111 supports a posture of an unillustrated insulating layer provided between the conductive layers 102, in a manufacturing step.

In addition, as shown in FIG. 3, the memory finger MF includes a conductive layer 108. The conductive layer 108 faces side surfaces in a Y direction of the plurality of conductive layers 102, and has a plate-like shape extending in the X direction and the Z direction. Moreover, a lower end of the conductive layer 108 contacts the substrate 101. The conductive layer 108 is configured from a conductive layer of the likes of tungsten (W), for example, and functions as the source contact LI.

In addition, as shown in FIG. 3, the memory finger MF includes a plurality of conductive layers 106 and a conductive layer 107 that are positioned above the plurality of conductive layers 102 and memory columnar bodies 105, are arranged in plurality in the X direction, and extend in the Y direction. The memory columnar bodies 105 are respectively connected to lower surfaces of the conductive layers 106. The conductive layer 106 is configured from a conductive layer of the likes of tungsten (W), for example, and functions as the bit line BL. Moreover, the conductive layer 108 is connected to a lower surface of the conductive layer 107. The conductive layer 107 is configured from a conductive layer of the likes of tungsten (W), for example, and functions as the source line SL.

Figure 4:
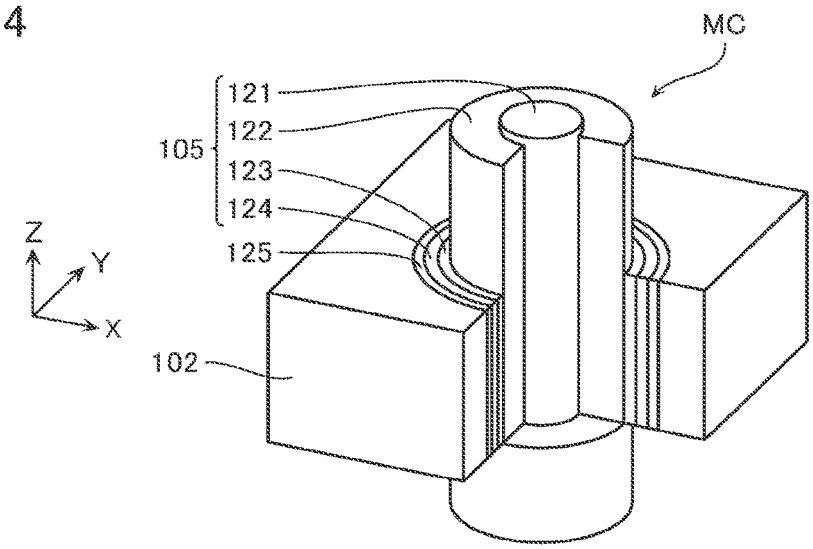
FIG. 4 is a perspective view showing a configuration of part of the same nonvolatile semiconductor memory device.

Next, a schematic configuration of the memory cell MC will be described with reference to FIG. 4. FIG. 4 is a schematic perspective view showing the configuration of the memory cell MC. Note that FIG. 4 shows the configuration of the memory cell MC, but the lowermost layer source side select gate transistor STSb, the source side select gate transistor STS, and the drain side select gate transistor STD may also be configured similarly to the memory cell MC. Note that in FIG. 4, part of the configuration is omitted.

As shown in FIG. 4, the memory cell MC is provided at an intersection of the conductive layer 102 and the memory columnar body 105. The memory columnar body 105 includes: a core insulating layer 121; and a semiconductor layer 122, a tunnel insulating layer 123, and a charge accumulation layer 124 that are stacked on a sidewall of the core insulating layer 121. Furthermore, a block insulating layer 125 is provided between the memory columnar body 105 and the conductive layer 102.

The core insulating layer 121 is configured from an insulating layer of the likes of silicon oxide ($SiO_2$), for example. The semiconductor layer 122 is configured from a semiconductor layer of the likes of polysilicon, for example, and functions as a channel body of the memory cell MC, the lowermost layer source side select gate transistor STSb, the source side select gate transistor STS, and the drain side select gate transistor STD. The tunnel insulating layer 123 is configured from an insulating layer of the likes of silicon oxide (SiO$_2$), for example. The charge accumulation layer 124 is configured from an insulating layer capable of accumulating a charge, of the likes of silicon nitride (SiN), for example. The block insulating layer 125 is configured from an insulating layer of the likes of silicon oxide (SiO$_2$), for example.

Figure 5:
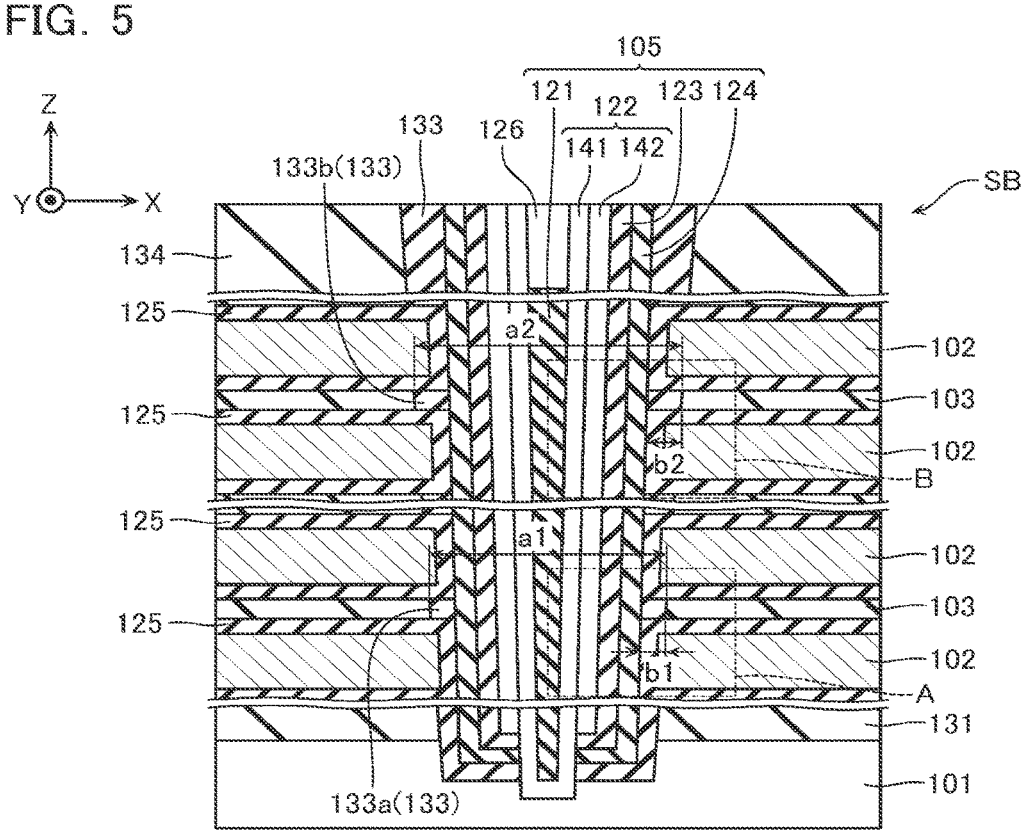
FIG. 5 is a cross-sectional view showing a configuration of part of the same nonvolatile semiconductor memory device.

Next, the nonvolatile semiconductor memory device according to the present embodiment will be described in more detail with reference to FIG. 5. FIG. 5 is a cross-sectional view showing a configuration of part of the same nonvolatile semiconductor memory device.

As shown in FIG. 5, the nonvolatile semiconductor memory device according to the present embodiment includes: the substrate 101; a stacked body SB provided above the substrate 101; and the memory columnar body 105 extending in the Z direction. The stacked body SB includes a plurality of the conductive layers 102 provided above the substrate 101, and functions as the control gates of the memory cell MC, the word lines WL, and so on. The memory columnar body 105 includes the semiconductor layer 122 having the Z direction perpendicular to the substrate 101 as its longitudinal direction, and functions as the channel body of the memory cell MC, and so on.

As shown in FIG. 5, the stacked body SB includes a plurality of the conductive layers 102 and inter-layer insulating layers 103 provided alternately above the substrate 101. The conductive layer 102 is formed from a conductive material of the likes of tungsten (W), for example, and functions as the control gate of the memory cell MC, the word line WL, and so on. Moreover, the inter-layer insulating layer 103 is formed from an insulating material of the likes of silicon oxide (SiO$_2$), for example.

In addition, as shown in FIG. 5, the stacked body SB includes the block insulating layer 125 that covers an upper surface, lower surface, and side surface of the conductive layer 102. The block insulating layer 125 is formed from an insulating material of the likes of silicon oxide (SiO$_2$), for example.

As shown in FIG. 5, the memory columnar body 105 includes: the core insulating layer 121 extending in the Z direction; and a first semiconductor layer 141, a second semiconductor layer 142, the tunnel insulating layer 123, and the charge accumulation layer 124 that sequentially cover the sidewall of the core insulating layer 121. The core insulating layer 121 is configured from an insulating layer of the likes of silicon oxide (SiO$_2$), for example. The first semiconductor layer 141 and the second semiconductor layer 142 are configured from a semiconductor layer of the likes of polysilicon, for example, and configure the semiconductor layer 122 that functions as the channel body of the memory cell MC, and so on. The tunnel insulating layer 123 is configured from an insulating layer of the likes of silicon oxide (SiO$_2$), for example. The charge accumulation layer 124 is configured from an insulating layer capable of accumulating a charge, of the likes of silicon nitride (SiN), for example.

In addition, as shown in FIG. 5, the nonvolatile semiconductor memory device according to the present embodiment includes a cover insulating layer 133. The cover insulating layer 133 is positioned between the memory columnar body 105 and the inter-layer insulating layer 103. The cover insulating layer 133 is configured from an insulating material of the likes of silicon oxide (SiO$_2$), for example, and protects the charge accumulation layer 124 during a manufacturing step.

Now, as shown in FIG. 5, in the present embodiment, a plurality of the cover insulating layers 133 are provided in the Z direction along the memory columnar body 105. The cover insulating layer 133 according to the present embodiment has an external diameter (diameter in the XY plane) which is smaller the more downwardly it is positioned, and an external diameter which is larger the more upwardly it is positioned. Moreover, the cover insulating layer 133 according to the present embodiment has a film thickness which is smaller the more downwardly it is positioned, and a film thickness which is larger the more upwardly it is positioned.

For example, as shown in FIG. 5, a certain cover insulating layer 133 is assumed to be a first cover insulating layer 133a, and a cover insulating layer 133 positioned more upwardly than this first cover insulating layer 133a is assumed to be a second cover insulating layer 133b. In this case, an external diameter a1 of the first cover insulating layer 133a positioned downwardly is smaller than an external diameter a2 of the second cover insulating layer 133b positioned upwardly. Moreover, a film thickness b1 of the first cover insulating layer 133a positioned downwardly is smaller than a film thickness b2 of the second cover insulating layer 133b positioned upwardly.

In such a nonvolatile semiconductor memory device, variation in diameter in the XY plane of the memory columnar body 105 is suppressed, whereby variation in characteristics of the memory cell MC is suppressed.

That is, as shown in FIG. 5, the memory columnar body 105 according to the present embodiment has a columnar shape extending in the Z direction. Such a structure can be manufactured by providing a stacked body SBA with an opening op1 extending in the Z direction as shown in FIG. 10 and forming in this opening op1 each of layers configuring the memory columnar body 105 as shown in FIGS. 11 to 14.

Figure 10:
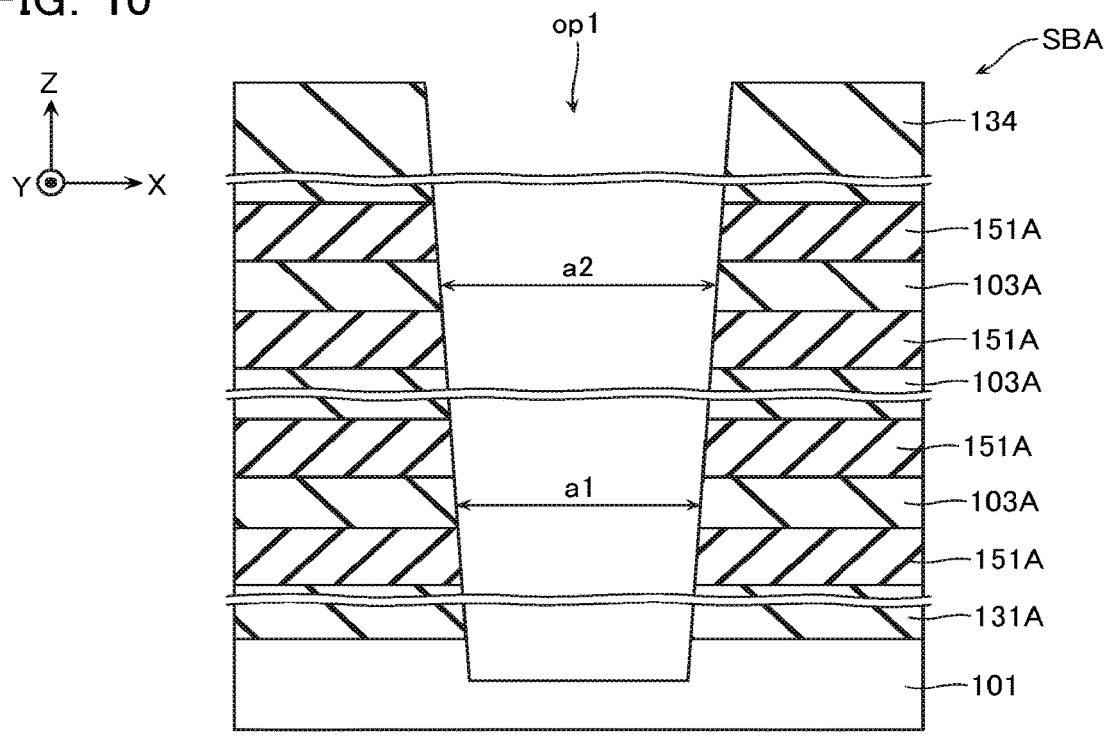
FIG. 10 is a cross-sectional view showing the same method of manufacturing.

Now, as shown in FIG. 10, it sometimes occurred that when providing the opening op1 in the stacked body SBA, an internal diameter of the opening op1 got smaller the more downwardly a portion of the opening op1 was positioned and got larger the more upwardly a portion of the opening op1 was positioned. In this case, it sometimes occurred that when, for example, a film thickness of a cover insulating 133A got made uniformly, an external diameter of the memory columnar body 105 ended up varying to the same extent as the internal diameter of the opening op1, and characteristics of the memory cell MC ended up varying greatly.

Figure 11:
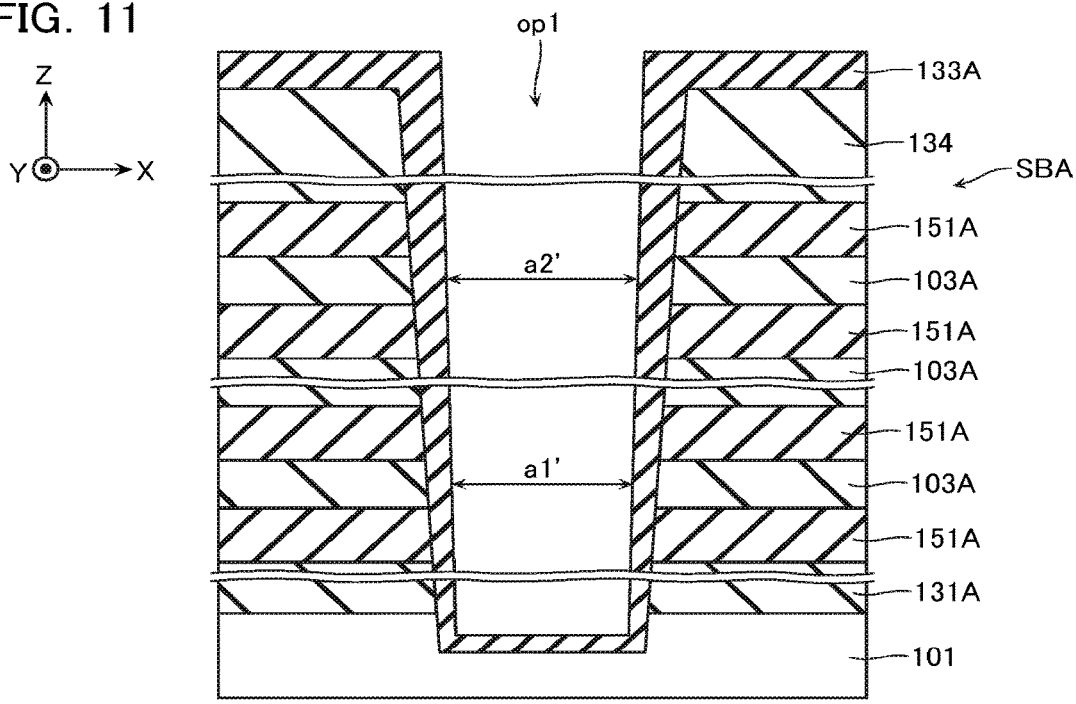
FIG. 11 is a cross-sectional view showing the same method of manufacturing.

Accordingly, in the present embodiment, as shown in FIG. 11, the film thickness of the cover insulating layer 133A is configured to be smaller the more downwardly a portion of the cover insulating layer 133A is positioned and to be larger the more upwardly a portion of the cover insulating layer 133A is positioned. This makes it possible to suppress variation in the internal diameter of the opening op1 and suppress variation in the external diameter of the memory columnar body 105, thereby suppressing variation in characteristics of the memory cell MC.

Figure 18:
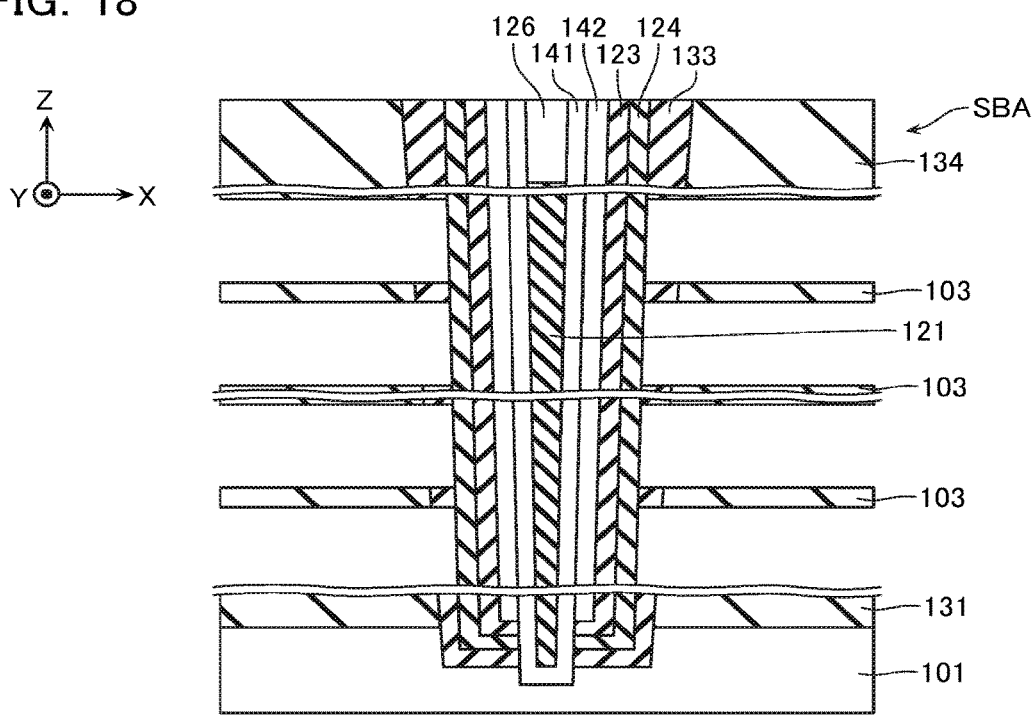
FIG. 18 is a cross-sectional view showing the same method of manufacturing.

Note that as shown in FIG. 18, the cover insulating layer 133A is divided in the Z direction in a subsequent step and becomes a plurality of the cover insulating layers 133. Moreover, external diameters of these plurality of cover insulating layers 133 match the internal diameter of the opening op1 described with reference to FIG. 10. Therefore, as described with reference to FIG. 5, the external diameter a1 of the first cover insulating layer 133a positioned downwardly is smaller than the external diameter a2 of the second cover insulating layer 133b positioned upwardly. Moreover, film thicknesses of these plurality of cover insulating layers 133 match the film thickness of the cover insulating layer 133A described with reference to FIG. 11. Therefore, as described with reference to FIG. 5, the film thickness b1 of the first cover insulating layer 133a positioned downwardly is smaller than the film thickness b2 of the second cover insulating layer 133b positioned upwardly.

Figure 6:
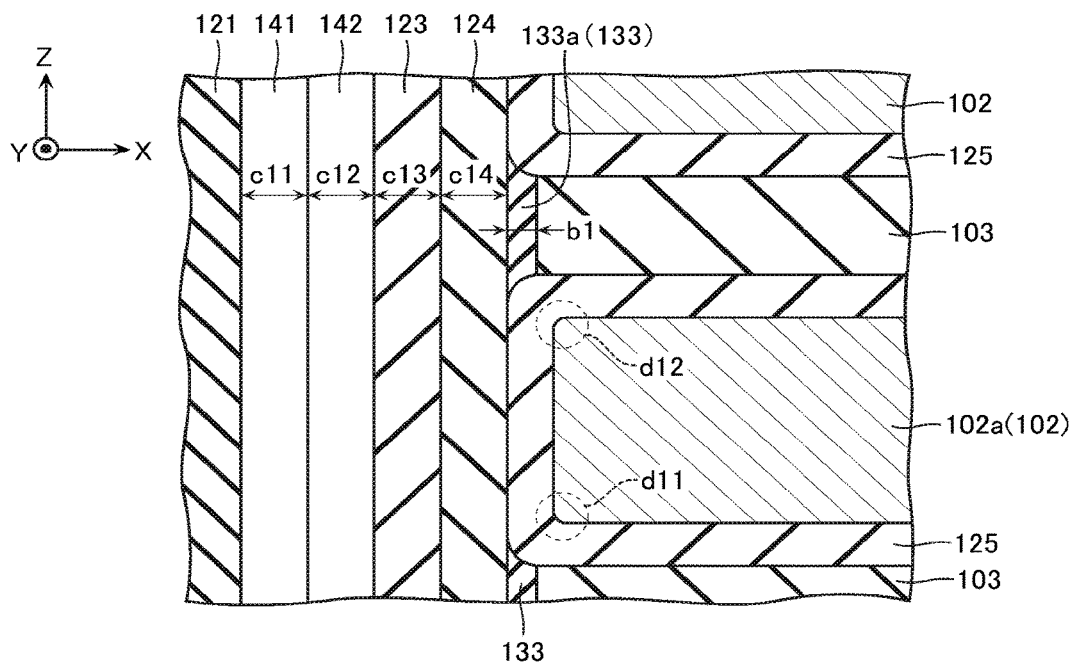
FIG. 6 is a cross-sectional view showing a configuration of part of the same nonvolatile semiconductor memory device.
Figure 7:
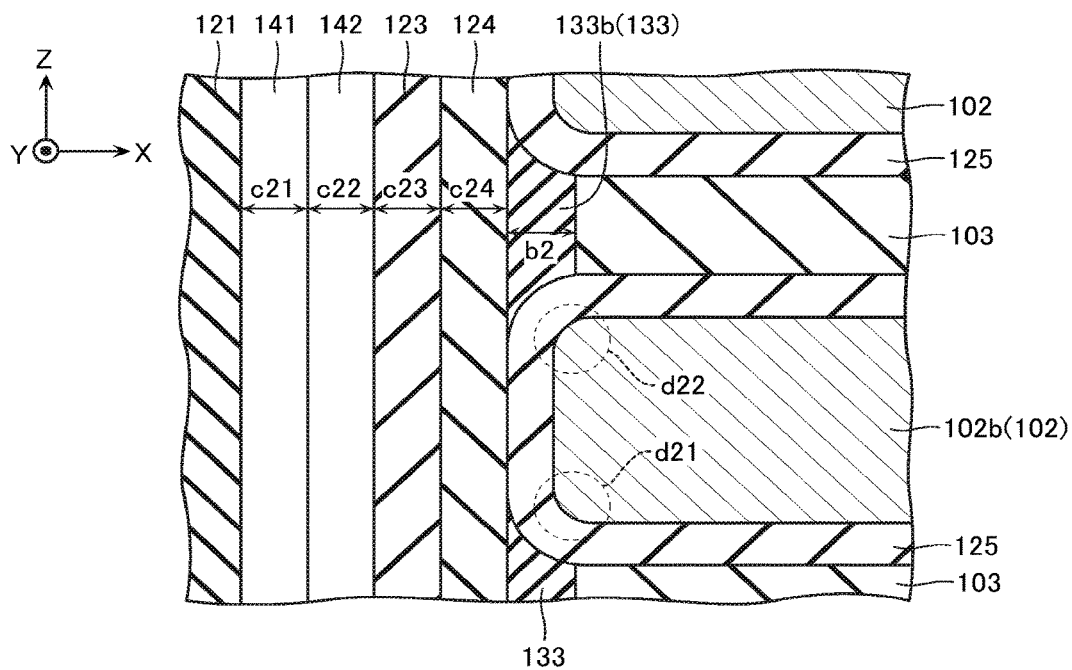
FIG. 7 is a cross-sectional view showing a configuration of part of the same nonvolatile semiconductor memory device.

Next, the nonvolatile semiconductor memory device according to the present embodiment will be described in more detail with reference to FIGS. 6 and 7. FIGS. 6 and 7 are cross-sectional views showing a configuration of part of the same nonvolatile semiconductor memory device, and show enlarged a portion indicated by A of FIG. 5 and a portion indicated by B of FIG. 5, respectively.

As shown in FIGS. 6 and 7, in the nonvolatile semiconductor memory device according to the present embodiment, the sidewall of the core insulating layer 121 extending in the Z direction is covered by the first semiconductor layer 141, the second semiconductor layer 142, the tunnel insulating layer 123, and the charge accumulation layer 124. Moreover, a sidewall of part of the charge accumulation layer 124 is covered by the cover insulating layer 133 and the inter-layer insulating layer 103.

Now, in the present embodiment, the cover insulating layer 133A (FIG. 11) is provided with a film thickness difference, thereby suppressing variation in characteristics of the memory cell MC. In contrast, in order to further suppress variation in characteristics of the memory cell MC, it is desirable that film thicknesses of the first semiconductor layer 141, the second semiconductor layer 142, the tunnel insulating layer 123, and the charge accumulation layer 124 are uniform. Accordingly, as shown in FIGS. 6 and 7, in the present embodiment, it may be configured such that at two different height positions, film thicknesses c11 and c21 of the first semiconductor layer 141, film thicknesses c12 and c22 of the second semiconductor layer 142, film thicknesses c13 and c23 of the tunnel insulating layer 123, and film thicknesses c14 and c24 of the charge accumulation layer 124 are substantially uniform between the downward position and the upward position. At least, a film thickness difference (c24−c14) of the charge accumulation layer 124 at certain different height positions may be configured smaller than a film thickness difference (b2−b1) of the cover insulating layer 133. Moreover, in view of magnitude of film thicknesses, it may be configured such that (c24−c14)/c24+c14)<(b2−b1)/b2+b1) holds. Furthermore, it may be configured such that a similar relationship to that with the charge accumulation layer 124 holds also for the first semiconductor layer 141, the second semiconductor layer 142, and the tunnel insulating layer 123.

In addition, in the present embodiment, it is possible for the cover insulating layer 133 and the inter-layer insulating layer 103 to be formed by different methods, for example. In this case, at least one of the cover insulating layer 133 and the inter-layer insulating layer 103 sometimes includes an impurity not included in the other. For example, when the inter-layer insulating layer 103 is deposited by (plasma) CVD employing an organic raw material gas and the cover insulating layer 133 is deposited by CVD employing an inorganic raw material gas, sometimes, carbon is included in the inter-layer insulating layer 103 and carbon is not included in the cover insulating layer 133.

Moreover, the cover insulating layer 133 and the inter-layer insulating layer 103 sometimes have etching rates with respect to a certain chemical solution or gas that differ. For example, an etching rate with respect to hot phosphoric acid or dilute hydrofluoric acid of the cover insulating layer 133 is smaller or larger than an etching rate with respect to hot phosphoric acid or dilute hydrofluoric acid of the inter-layer insulating layer 103.

In addition, as shown in FIGS. 6 and 7, in the present embodiment, the conductive layer 102 is provided between the inter-layer insulating layers 103 adjacent in the Z direction. Moreover, the upper surface, lower surface, and side surface of the conductive layer 102 are covered by the block insulating layer 125.

Now, as shown in FIGS. 6 and 7, a certain conductive layer 102 is assumed to be a first conductive layer 102a, and a conductive layer positioned more upwardly than this first conductive layer 102a is assumed to be a second conductive layer 102b. Moreover, a side surface facing the charge accumulation layer 124 (side surface facing the semiconductor layer 122), of the conductive layer 102 is assumed to be a facing surface. In this case, shapes of a facing surface lower portion d11 and a facing surface upper portion d12 of the first conductive layer 102a are different from shapes of a facing surface lower portion d21 and a facing surface upper portion d22 of the second conductive layer 102b. For example, a radius of curvature in the facing surface lower portion d11 and facing surface upper portion d12 of the first conductive layer 102a are smaller than a radius of curvature in the facing surface lower portion d21 and facing surface upper portion d22 of the second conductive layer 102b. Such a difference in shapes is due to the film thickness difference of the cover insulating layer 133.

[Method of Manufacturing]

Figure 8:
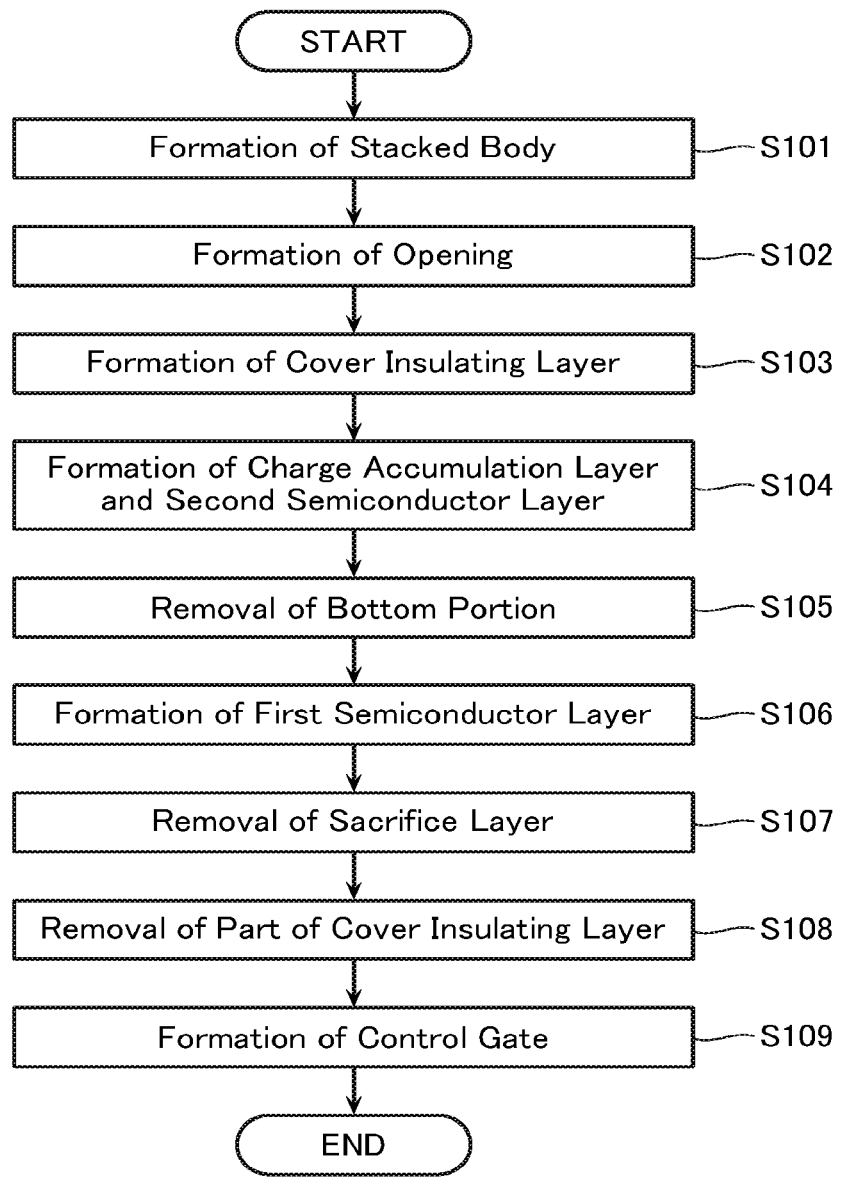
FIG. 8 is a flowchart showing a method of manufacturing the same nonvolatile semiconductor memory device.

Next, a method of manufacturing the nonvolatile semiconductor memory device according to the first embodiment will be described with reference to FIGS. 8 to 20. FIG. 8 is a flowchart for explaining the same method of manufacturing. FIGS. 9 to 20 are cross-sectional views for explaining the same method of manufacturing.

Figure 9:
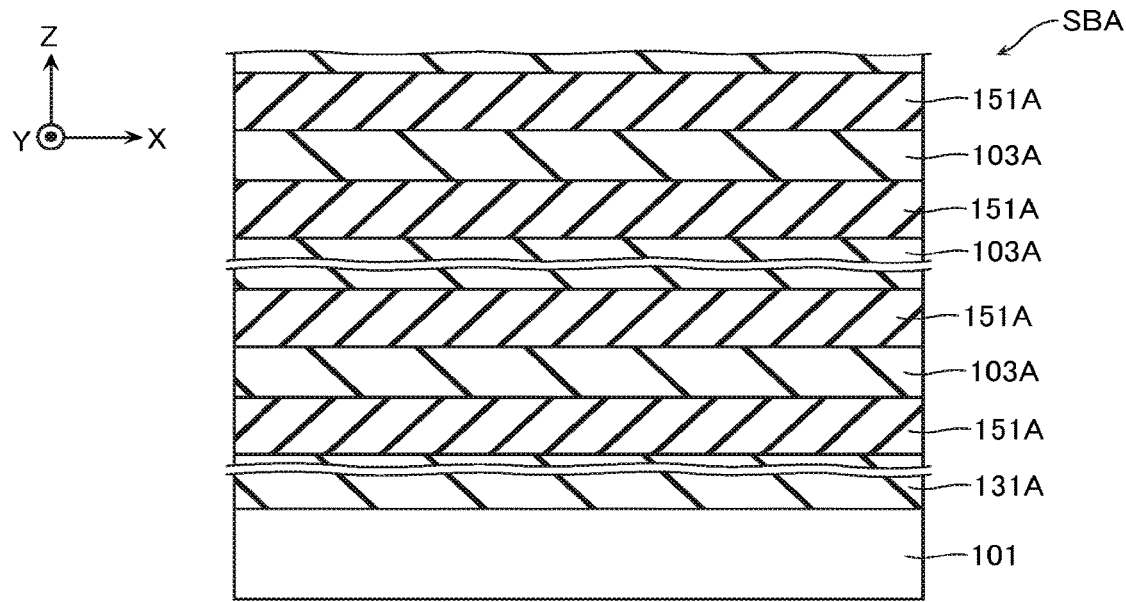
FIG. 9 is a cross-sectional view showing the same method of manufacturing.

As shown in FIGS. 8 and 9, in step S101, an insulating layer 131A is stacked above the substrate 101, and a plurality of layers of insulating layers 103A which will be the inter-layer insulating layers 103, and sacrifice layers 151A are alternately stacked to form the stacked body SBA. The insulating layer 131A and the insulating layer 103A are configured from silicon oxide ($SiO_2$), for example. Moreover, the sacrifice layer 151A is configured from silicon nitride (SiN), for example.

Now, in the present embodiment, the insulating layer 103A is deposited by plasma CVD (Chemical Vapor Deposition) employing an organic raw material gas. As a result, carbon is included in the insulating layer 103A. Note that the insulating layer 103A may also be deposited by a variety of methods besides plasma CVD employing an organic raw material gas.

As shown in FIGS. 8 and 10, in step S102, the opening op1 is formed in the stacked body SBA. That is, first, an insulating layer 134 is formed on an upper surface of the stacked body SBA. A portion corresponding to the opening op1, of the insulating layer 134 is provided with an opening. Next, anisotropic etching such as RIE (Reactive Ion Etching) is performed using this insulating layer 134 as a mask, and the opening op1 is formed in the stacked body SBA. The opening op1 penetrates the insulating layer 131A and the plurality of insulating layers 103A and sacrifice layers 151A stacked in a layer above the insulating layer 131A.

Now, as shown in FIG. 10, in step S102, the opening op1 is formed such that an internal diameter of the opening op1 is smaller the more downwardly a portion of the opening op1 is positioned and larger the more upwardly a portion of the opening op1 is positioned. For example, as shown in FIG. 10, an internal diameter a1 at a certain height position (a first height position), of the opening op1 is smaller than an internal diameter a2 at another height position (a second height position) more upward (higher) than this certain height position.

As shown in FIGS. 8 and 11, in step S103, the cover insulating layer 133A which will be the cover insulating layers 133 is formed. The cover insulating layer 133A is configured from silicon oxide ($SiO_2$), for example. The cover insulating layer 133A covers an inner wall of the opening op1 and the upper surface of the stacked body SBA. Note that the cover insulating layer 133A may be deposited by a variety of means, but in the present embodiment, the cover insulating layer 133A is formed by a CVD method such as LPCVD (Low Pressure Chemical Vapor Deposition) or plasma CVD.

Now, as shown in FIG. 11, in step S103, the cover insulating layer 133A is formed such that a film thickness of the cover insulating layer 133A is smaller the more downwardly a portion of the cover insulating layer 133A is positioned and larger the more upwardly a portion of the cover insulating layer 133A is positioned. Therefore, for example, as shown in FIG. 11, the internal diameter at the certain height position (the first height position), of the opening op1 decreases to a1' (<a1), and the internal diameter at another height position (the second height position) more upward than this certain height position decreases to a2' (<a2). A difference a2'−a1' of these internal diameters is smaller than a difference a2−a1 of the internal diameters before film deposition of the cover insulating layer 133A.

Figure 12:
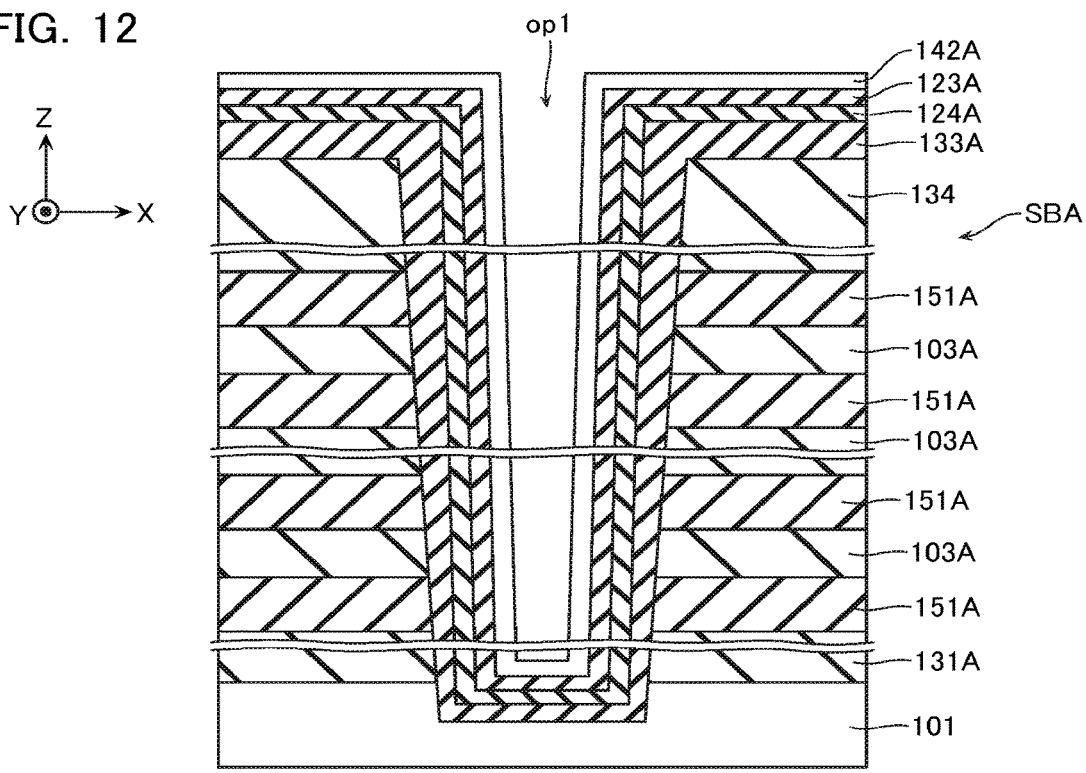
FIG. 12 is a cross-sectional view showing the same method of manufacturing.

As shown in FIGS. 8 and 12, in step S104, a charge accumulation layer 124A which will be the charge accumulation layer 124, an insulating layer 123A which will be the tunnel insulating layer 123, and a semiconductor layer 142A which will be the second semiconductor layer 142, are formed. The charge accumulation layer 124A, the insulating layer 123A, and the semiconductor layer 142A cover the inner wall of the opening op1 and the upper surface of the stacked body SBA. Note that the insulating layer 123A is configured from silicon oxide ($SiO_2$), for example. Moreover, the charge accumulation layer 124A is configured from silicon nitride (SiN), for example. Moreover, the semiconductor layer 142A is configured form amorphous-state silicon, for example.

Figure 13:
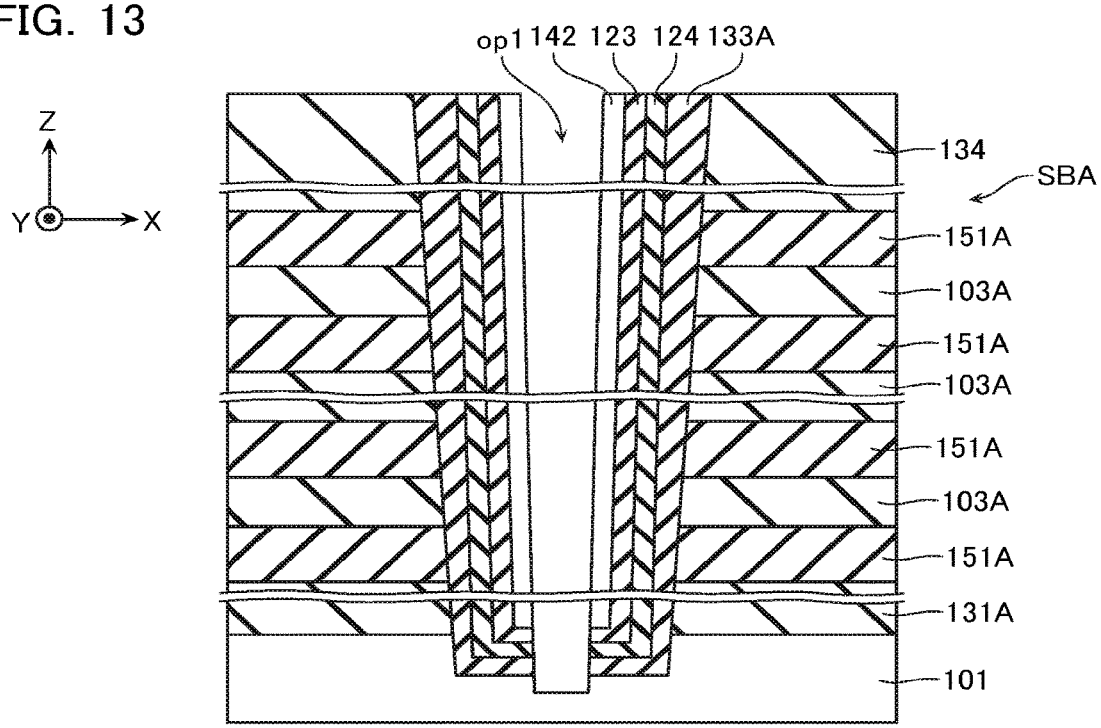
FIG. 13 is a cross-sectional view showing the same method of manufacturing.

As shown in FIGS. 8 and 13, in step S105, portions positioned in a bottom portion of the opening op1, of the cover insulating layer 133A, the charge accumulation layer 124A, the insulating layer 123A, and the semiconductor layer 142A are removed, and an upper surface of the substrate 101 is exposed.

Figure 14:
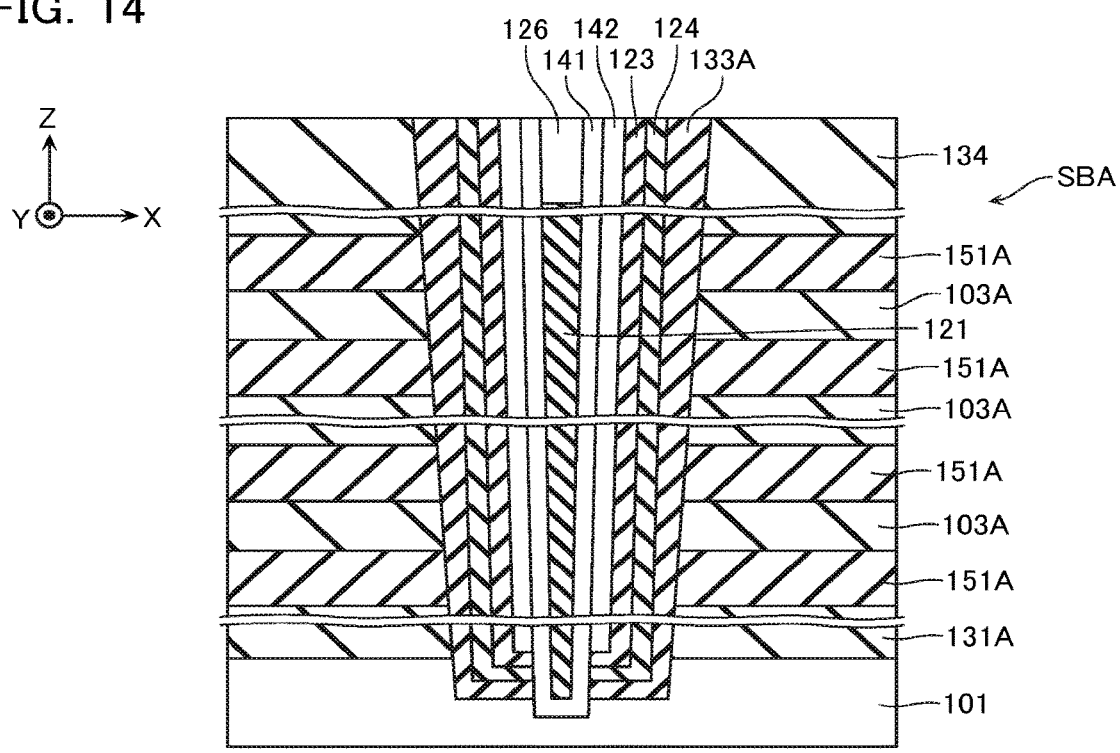
FIG. 14 is a cross-sectional view showing the same method of manufacturing.
Figure 15:
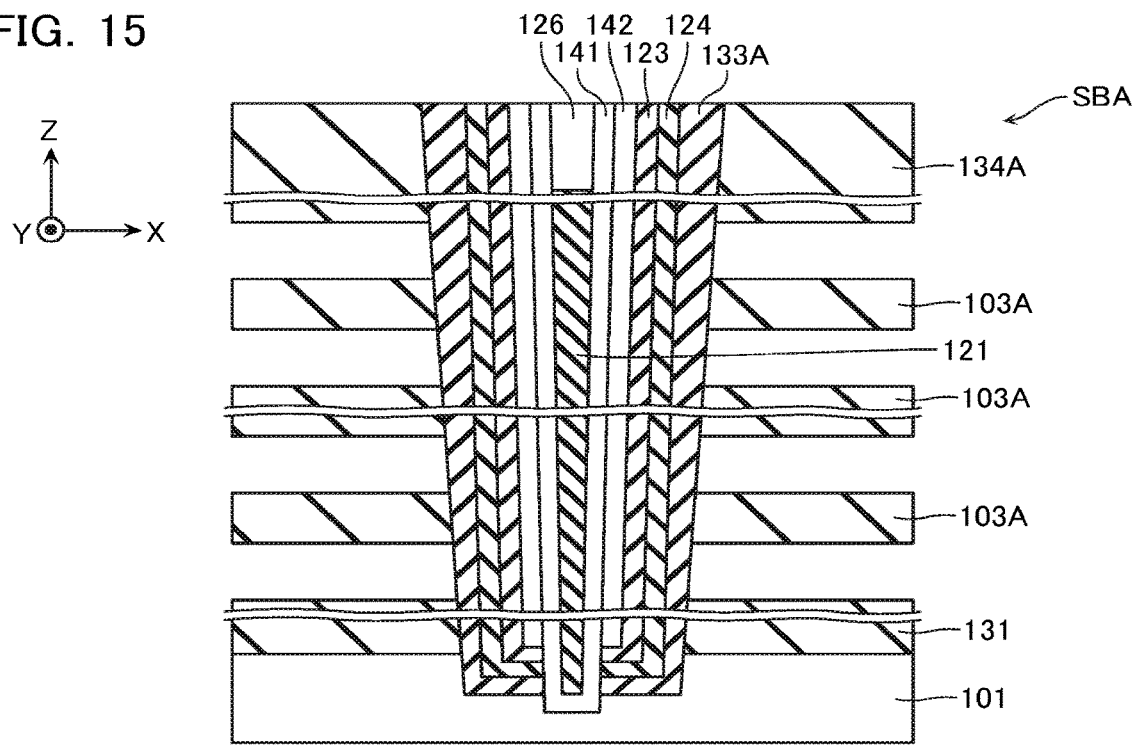
FIG. 15 is a cross-sectional view showing the same method of manufacturing.

As shown in FIGS. 8 and 14, in step S106, the first semiconductor layer 141 is formed. The first semiconductor layer 141 is configured from amorphous-state silicon, for example. Note that subsequently, heat treatment, and so on, may be performed and the first semiconductor layer 141 and second semiconductor layer 142 configured as polycrystalline-state silicon. Moreover, as shown in FIG. 14, the core insulating layer 121 and a conductive layer 126 may be formed on an inner wall of the first semiconductor layer 141.

As shown in FIGS. 8 and 15 to 17, in step S107, a trench that reaches upper surface of the substrate 101 is formed in a region separated from a region where the memory cell MC is formed, of the stacked body SBA, and the sacrifice layer 151A is removed by a means such as wet etching employing hot phosphoric acid, from a side surface of this trench.

As shown in FIGS. 8 and 18 to 20, in step S108, part of the cover insulating layer 133A is removed by a means such as wet etching employing hydrofluoric acid, to expose the charge accumulation layer 124. As a result, a plurality of the cover insulating layers 133 divided in the Z direction are formed.

Figure 16:
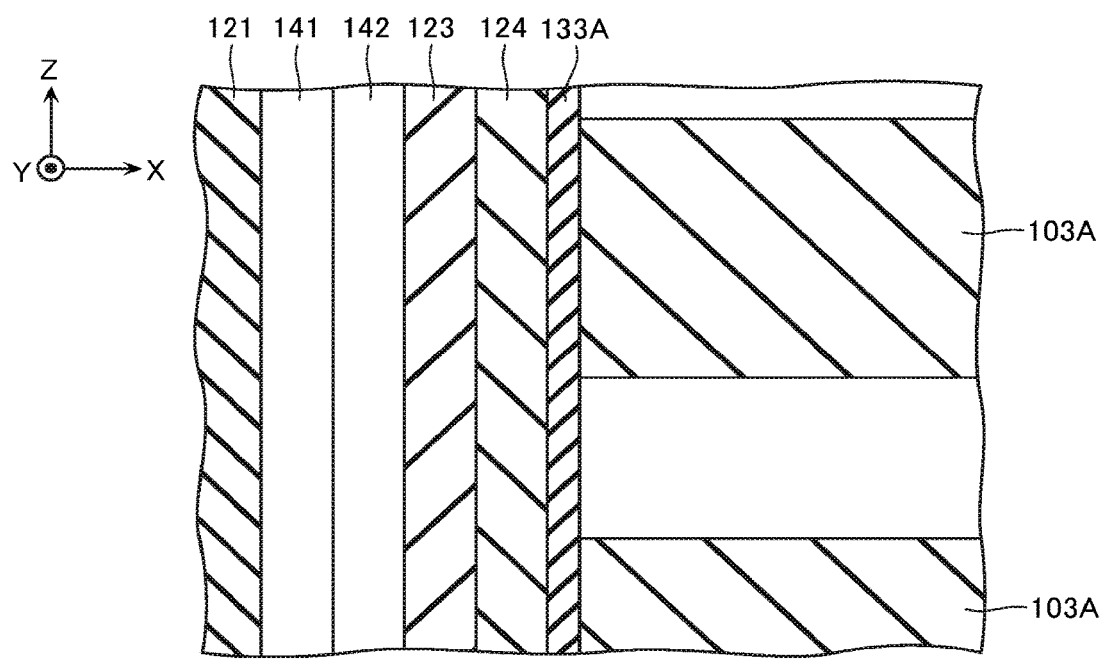
FIG. 16 is a cross-sectional view showing the same method of manufacturing.
Figure 17:
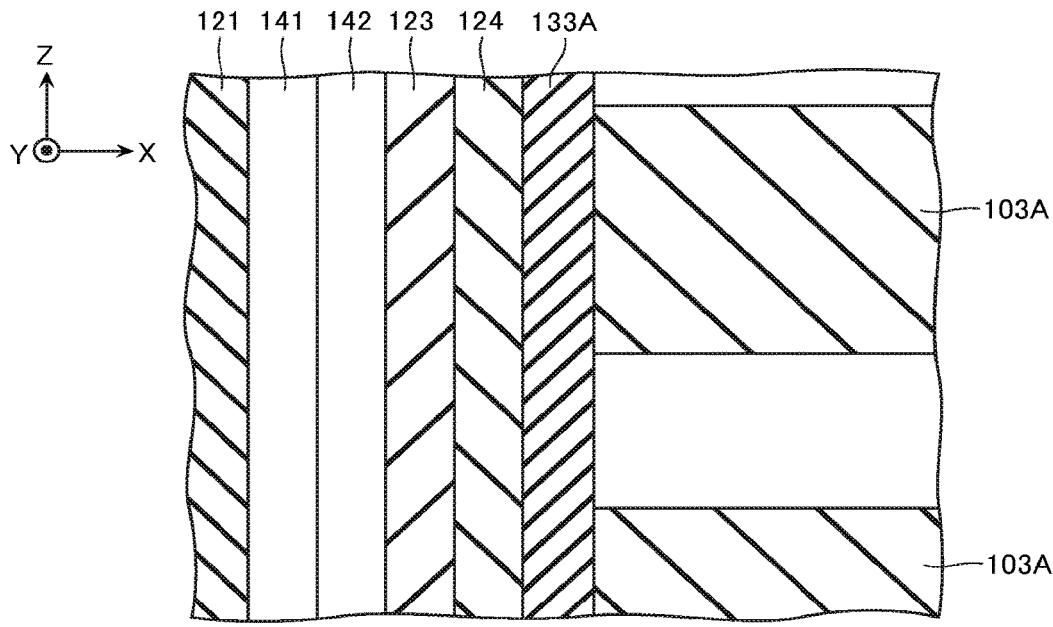
FIG. 17 is a cross-sectional view showing the same method of manufacturing.
Figure 19:
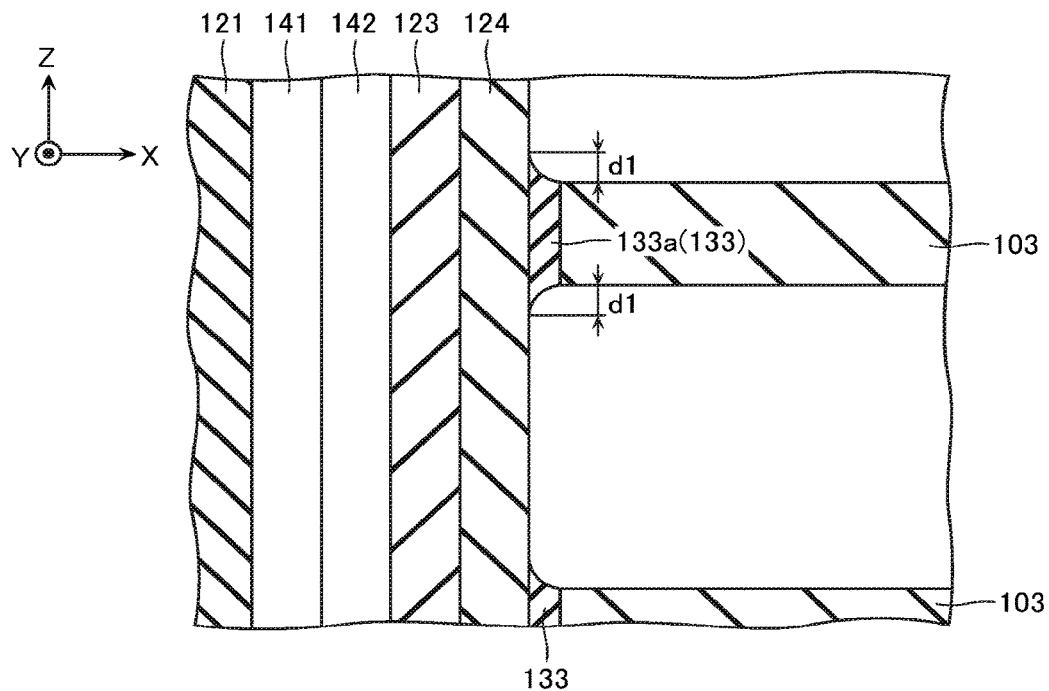
FIG. 19 is a cross-sectional view showing the same method of manufacturing.
Figure 20:
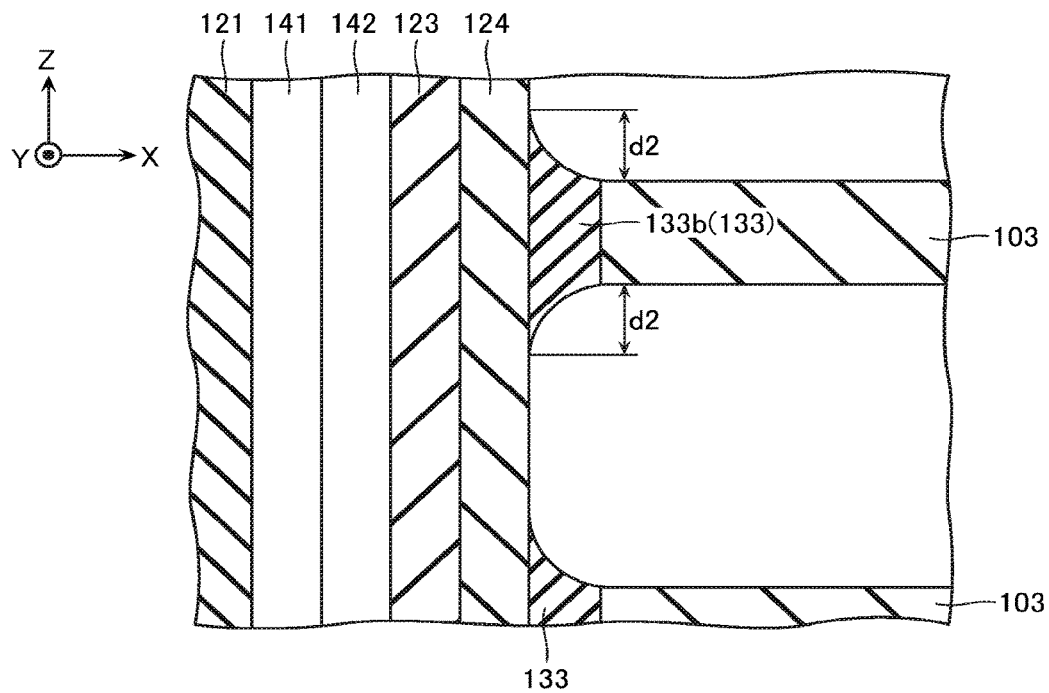
FIG. 20 is a cross-sectional view showing the same method of manufacturing.

Now, as shown in FIGS. 16 and 17, the film thickness of the cover insulating layer 133A removed in step S108 is smaller the lower its position is and larger the higher its position is. Therefore, in the case where, for example, in the wet etching employing hydrofluoric acid, the etching rate of the inter-layer insulating layer 103 is larger than the etching rate of the cover insulating layer 133A, in a region where the film thickness of the cover insulating layer 133A is comparatively small of the kind shown in FIG. 16, a height difference d1 of an upper surface or lower surface of a cover insulating layer 133a is comparatively small as shown in FIG. 19. On the other hand, in a region where the film thickness of the cover insulating layer 133A is comparatively large of the kind shown in FIG. 17, a height difference d2 of an upper surface or lower surface of a cover insulating layer 133b is comparatively large as shown in FIG. 20.

As shown in FIGS. 8 and 5 to 7, in step S109, the conductive layer 102 functioning as the control gate electrode of the memory cell MC, and so on, is formed. That is, the block insulating layer 125 is formed on an upper surface, lower surface, and side surface of the inter-layer insulating layer 103 and on a side surface of the charge accumulation layer 124. Moreover, a conductive layer 102A which will be the conductive layer 102 is formed in a portion between the inter-layer insulating layers 103 adjacent in a stacking direction.

As a result of the above steps, the nonvolatile semiconductor memory device described with reference to FIGS. 5 to 7 is manufactured.

Other Embodiments

Figure 21:
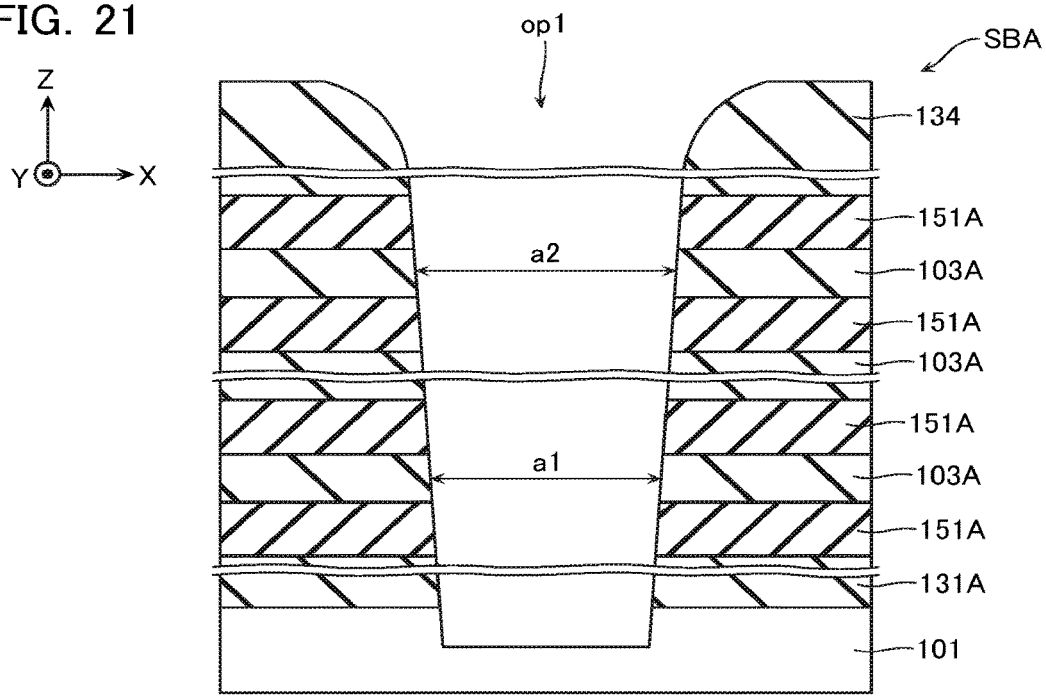
FIG. 21 is a cross-sectional view showing a method of manufacturing a nonvolatile semiconductor memory device according to another embodiment.
Figure 22:
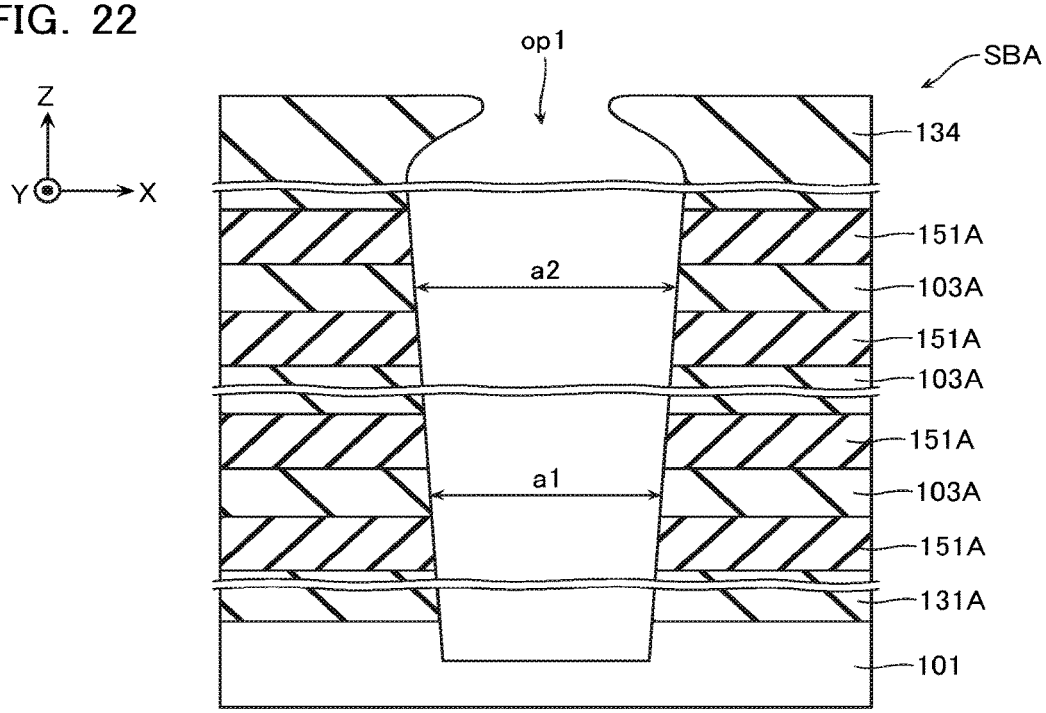
FIG. 22 is a cross-sectional view showing a method of manufacturing a nonvolatile semiconductor memory device according to another embodiment.

As described with reference to FIG. 10, in the method of manufacturing according to the first embodiment, the opening op1 was formed such that the internal diameter of the opening op1 is smaller the more downwardly a portion of the opening op1 is positioned and larger the more upwardly a portion of the opening op1 is positioned. Now, as shown in FIGS. 21 and 22, for example, when forming the opening op1, a shape of an upper end of the opening op1 may differ. That is, as shown in FIG. 21, the upper end of the opening op1 may broaden as the upper surface of the stacked body SBA is approached. Moreover, as shown in FIG. 22, the upper end of the opening op1 may narrow as the upper surface of the stacked body SBA is approached. However, in either case, in a portion where the inter-layer insulating layers 103A and sacrifice layers 151A are stacked, the internal diameter of the opening op1 is smaller the more downwardly a portion of the opening op1 is positioned and larger the more upwardly a portion of the opening op1 is positioned. At least in a range in the Z direction of the kind where operating as a memory cell MC, the internal diameter of the opening op1 is smaller the more downwardly a portion of the opening op1 is positioned and larger the more upwardly a portion of the opening op1 is positioned.

Moreover, as described with reference to FIG. 11, in the first embodiment, the cover insulating layer 133A configured from silicon oxide ($SiO_2$) was formed by a CVD method such as LPCVD (Low Pressure Chemical Vapor Deposition) or plasma CVD. However, it is also possible for the cover insulating layer 133A configured from silicon oxide ($SiO_2$) to be formed by, for example, forming amorphous silicon (aSi) so as to cover the inner wall of the opening op1 and the upper surface of the stacked body SBA and oxidizing this amorphous silicon (aSi) by thermal oxidation treatment. In addition, it is also possible to oxidize the amorphous silicon (aSi), and so on, by a means other than thermal oxidation and thereby form the cover insulating layer.

Figure 23:
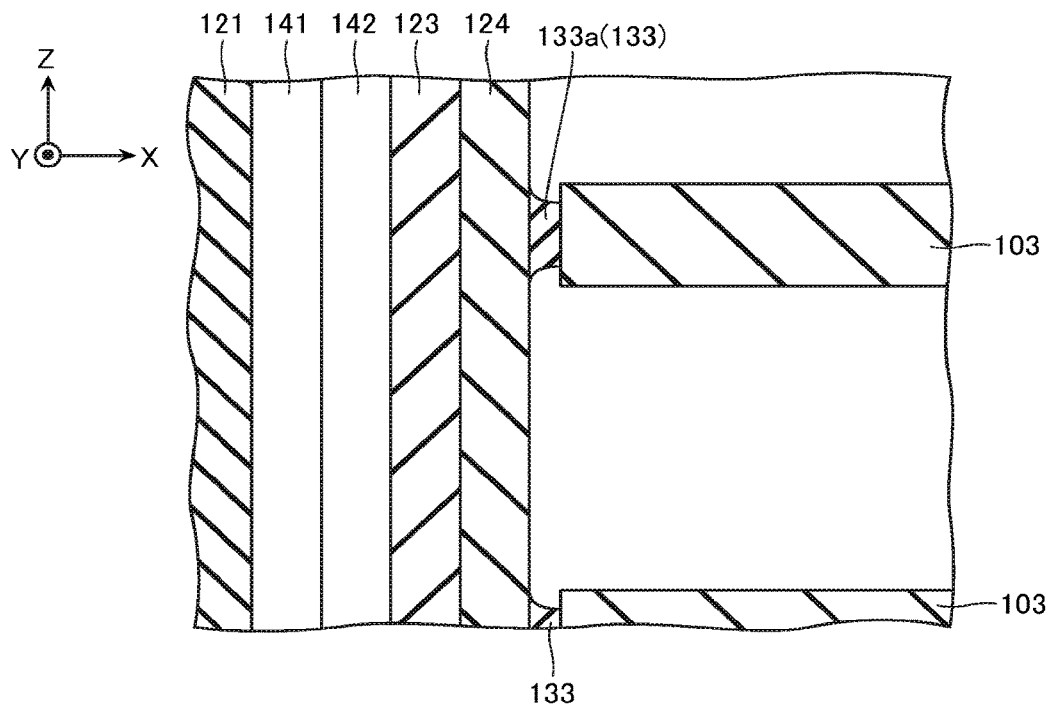
FIG. 23 is a cross-sectional view showing a method of manufacturing a nonvolatile semiconductor memory device according to another embodiment.
Figure 24:
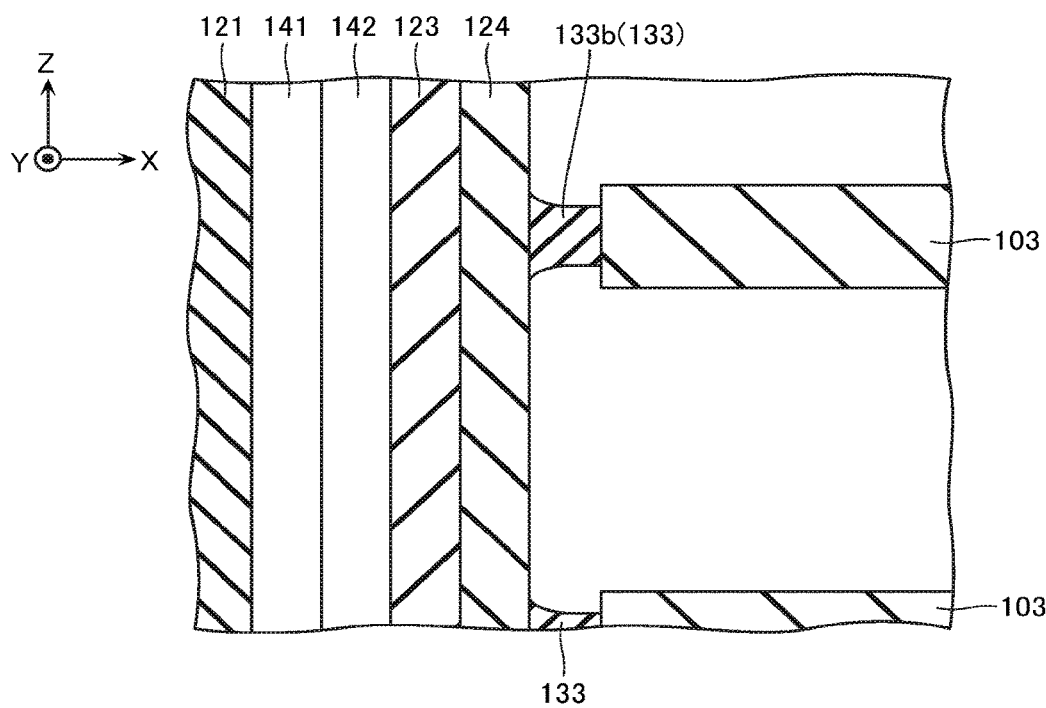
FIG. 24 is a cross-sectional view showing a method of manufacturing a nonvolatile semiconductor memory device according to another embodiment.

Moreover, in the first embodiment, as described with reference to FIGS. 19 and 20, in the wet etching of step S108, the etching rate of the inter-layer insulating layer 103 was larger than the etching rate of the cover insulating layer 133A. However, the etching rate of the inter-layer insulating layer 103 may be smaller than the etching rate of the cover insulating layer 133A. In such a case, in the region where the film thickness of the cover insulating layer 133A is comparatively small of the kind shown in FIG. 16, a cover insulating layer 133a having a comparatively small film thickness is formed as shown in FIG. 23. On the other hand, in the region where the film thickness of the cover insulating layer 133A is comparatively large of the kind shown in FIG. 17, a cover insulating layer 133b having a comparatively large film thickness is formed as shown in FIG. 24.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
    a plurality of control gate electrodes and a plurality of inter-layer insulating layers stacked alternately above a substrate;
    a semiconductor layer having as its longitudinal direction a first direction perpendicular to the substrate, the semiconductor layer facing the plurality of control gate electrodes;
    a charge accumulation layer positioned between the semiconductor layer and the control gate electrode; and
    a plurality of first insulating layers separated in the first direction and positioned between the semiconductor layer and the plurality of inter-layer insulating layers, one of the plurality of first insulating layers being a second insulating layer, and another of the plurality of first insulating layers being a third insulating layer positioned above the second insulating layer,
    an external diameter of the second insulating layer being smaller than an external diameter of the third insulating layer, and
    a film thickness of the second insulating layer being thinner than a film thickness of the third insulating layer.

2. The semiconductor memory device according to claim 1, wherein
    at least one of the plurality of inter-layer insulating layers and at least one of the plurality of first insulating layers are formed from silicon oxide.

3. The semiconductor memory device according to claim 1, wherein
    an impurity contained in at least one of the plurality of inter-layer insulating layers is not included in at least one of the plurality of first insulating layers, or
    an impurity contained in at least one of the plurality of first insulating layers is not included in at least one of the plurality of inter-layer insulating layers.

4. The semiconductor memory device according to claim 3, wherein
    at least one of the plurality of inter-layer insulating layers and at least one of the plurality of first insulating layers are configured from silicon oxide ($SiO_2$).

5. The semiconductor memory device according to claim 1, wherein
    an etching rate of at least one of the plurality of inter-layer insulating layers is different from an etching rate of at least one of the plurality of first insulating layers.

6. The semiconductor memory device according to claim 5, wherein
    the etching rates are with respect to hot phosphoric acid or dilute hydrofluoric acid.

* * * * *